United States Patent [19]
Masuda et al.

[11] Patent Number: 5,807,443
[45] Date of Patent: Sep. 15, 1998

[54] SPUTTERING TITANIUM TARGET ASSEMBLY AND PRODUCING METHOD THEREOF

[75] Inventors: Kaoru Masuda, Yasugi; Shigeru Taniguchi, Kashiwa; Akitoshi Hiraki, Yasugi, all of Japan

[73] Assignee: Hitachi Metals, Ltd., Tokyo, Japan

[21] Appl. No.: 757,818

[22] Filed: Nov. 27, 1996

[30] Foreign Application Priority Data

Nov. 30, 1995 [JP] Japan ..................................... 7-336207

[51] Int. Cl.⁶ .................................................. B23K 20/02
[52] U.S. Cl. ........................................... 148/535; 228/193
[58] Field of Search ..................... 148/535, 537; 228/193

[56] References Cited

U.S. PATENT DOCUMENTS

| | | | |
|---|---|---|---|
| 4,025,036 | 5/1977 | Melnyk ..................................... | 228/193 |
| 4,732,312 | 3/1988 | Kennedy et al. ........................ | 228/193 |
| 4,896,815 | 1/1990 | Rosenthal et al. ...................... | 228/193 |
| 5,562,999 | 10/1996 | Grunke et al. .......................... | 148/537 |

FOREIGN PATENT DOCUMENTS

| | | |
|---|---|---|
| 0 575 166 A1 | 6/1993 | European Pat. Off. . |
| 0 590 904 A1 | 9/1993 | European Pat. Off. . |
| 6-65733 | 3/1994 | Japan . |
| 6-108246 | 4/1994 | Japan . |

OTHER PUBLICATIONS

Japanese Industrial Standard, Surface Roughness, JIS B 0601–1476, revised Jun. 1982.

*Primary Examiner*—George Wyszomierski
*Attorney, Agent, or Firm*—Sughrue, Mion, Zinn, Macpeak & Seas, PLLC

[57] ABSTRACT

A cold-worked titanium material subjected to isostatic material and a backing plate are brought into contact with each other and subsequently hot-pressing. By such working the titanium material and the backing plate are bonded with each other by mutual diffusion and simultaneously the titanium material is recrystallized. The isostatic pressing is performed under a pressure of 50 to 200 MPa at a temperature of 300° to 450° C. The surface of the titanium material is preferably subjected to a surface roughening treatment to provide with a roughness level of 6S to 12S prior to the isostatic pressing.

4 Claims, 1 Drawing Sheet

25 μm

25 μm

SPUTTERING TITANIUM TARGET ASSEMBLY AND PRODUCING METHOD THEREOF

BACKGROUND OF THE INVENTION

The present invention relates to a sputtering titanium target assembly, and a method of producing a sputtering titanium target assembly, which is used to form a titanium-based thin layer by means of sputtering. Recently, sputtering has been widely used to form thin layers in precision parts such as a semiconductor element, a magnetic recording disk for a personal computer, and a liquid crystal display.

A target for sputtering is usually provided in the form of an assembly which consists of a target material and a backing plate, wherein the latter is bonded to the former. The backing plate is used to fix the target to a sputtering device, to transfer heat for preventing the target material from overheating during sputtering, and to discharge electric charge from the target.

Oxygen-free copper has high conductivities of heat and electricity, and is used for most backing plates. Sometimes, aluminum or aluminum alloys such as duralumin are also used for the backing plate.

The target material and the backing plate are usually bonded with each other using an indium- or a tin-based solder.

Larger titanium targets have been used recently to accomplish a higher efficiency in formation of a thin layer, wherein the electric power input for sputtering tends to increase.

For example, a pure-titanium target material used in a production of LSI is often charged with an electric power as high as tens of kilowatts, to compensate a decrease in film-forming rate caused by the use of a collimator. This causes an increased overheating of the target material; thus, it is an important task to maintain a high bonding reliability even at a high temperature.

A reliable bonding at a high temperature may be accomplished by the used having a a solder of high melting point, but there is a limitation in raising and melting point of the solder, and also there is a problem that the target material is contaminated with the flux used with the solder.

To solve such problems, a target is sometimes directly incorporated into the sputtering device without using a backing plate, while the advantages of using a backing plate, such as preventing the target from overheating and facilitating release of an electric charge during sputtering, are lost.

A new method is proposed to solve above problems, wherein a target material and a backing plate are bonded with each other by solid-state diffusion bonding. For example, JP-A-6-65733 discloses that a tensile bonding strength of 9.7 through 11.9 kgf/mm$^2$ (95.1 through 116.6 MPa) is obtained by diffusion bonding a titanium target material to an aluminum backing plate in 24 hours at 500° C. under a load of 800 tons. Also, JP-A-6-108246 discloses a method of diffusion bonding the target material to the backing plate using an inserted material having a melting point lower than that of the target material.

According to such diffusion bonding of a target material and a backing plate, the bonding strength can be approximately 10 through 20 times as strong as bonding with a normal solder, and is expected to remain reliable even at an increased temperature caused by an increased electric power input in sputtering.

Recently, with an increased integration of semiconductor elements as in LSI, the size of contact holes formed on semiconductor elements tends to decrease, and the aspect ratio tends to increase. When a film is deposited in a contact hole having such a high aspect ratio, there is a problem that the film is hardly deposited on the bottom of the contact hole. Accordingly, the sputtered grains are required to enter in a uniform direction along the axis of the respective holes into the contact hole to give a fully thick deposit at the bottom.

A conventional method, that has been brought into practice and is based on the improvement of the sputtering device, is to make sputtered grains reach a substrate in a uniform direction, on which the film is deposited, with utilization of a collimator set between the target material and the substrate, or by fully separating the target material and the substrate, the latter being called the distant sputtering method.

The average crystal grain size in titanium target materials normally is approximately 50 μm, while according to the present investigation, utilization of a titanium target material of extremely fine recrystallized grain structure having an average diameter not greater than approximately 10 μm was found to sufficiently collimate the sputtered grains.

Further, the recent highly integrated LSI has a finer circuit layout and a higher degree of lamination, both of which can cause a problem of "particle" or foreign matter generation in the sputtering process, which results in a lower yield of the product. Normally, a sputtering process in argon to form a pure titanium layer and a reactive sputtering process in an argon-nitrogen mixture to form a titanium nitride (TiN) layer are alternately applied to the titanium target material used to form an ohmic contact part of LSI's.

The present inventors investigated the relationship between the change in configuration of the titanium target material surface during sputtering and the generation of "particles". The result showed that one of the causes of "particle" formation was a titanium nitride (TiN) layer formed during the reactive sputtering on the surface of the titanium, which peeled off to form the "particles". An eroded uneven surface may form an arcking edge, and the impact of the abnormal electric discharge may peel off and scatter the "particles".

The present inventors confirmed that generation of the particles could be reduced by the control of crystal grains in the titanium target material to an extremely small size. Fine crystal grains may result in a smoother surface with minimal unevenness, which may hardly induce an abnormal electric discharge, and also may result in a more dispersed stress in the TiN layer, both of which may result in a reduced "particle" formation.

JP-A-6-10107 and JP-A-6-280009 also disclose the fact that a titanium target material of smaller crystal grain size generates less "particles" than a titanium target material of a larger crystal grain size.

The present inventors concluded that a crystal grain size much finer than in the conventional titanium target material is effective in making sputtered grains fly in a uniform direction and also in reducing the "article" generation during sputtering.

The inventors tried to produce a titanium target assembly having a fine recrystallized structure and having a sufficient resistance against a high electric power of the sputtering process by bonding the target material to a backing plate through the diffusion bonding described in JP-A-6-65733 without using a solder.

On the other hand, the fine crystal grains in the titanium target assembly prepared by the technique described in JP-A-6-65733 sometimes grew into larger particles when heated during the diffusion bonding process, resulting in an insufficient film thickness at the bottom of a contact hole.

SUMMARY OF THE INVENTION

The purpose of the present invention is to provide a method of efficiently producing a target assembly which generates less "particles" and can release sputtered grains in a more uniform direction from the target surface.

The present inventors studied the process of adjusting a titanium material structure required to obtain a target material and bonding the titanium target material directly to a aluminum base backing plate material through a diffusion bonding technique.

The inventors also found that both titanium and aluminum are readily diffusible so that an isostatic press machine can be used to diffusion-bond the two materials together at a temperature not higher than 500° C., and that titanium also can be recrystallized at a temperature not higher than 500° C., depending on the internal strain caused by a cold working. Namely, the inventors found that, under a specific condition using an isostatic press, which is disclosed in this invention, a titanium material can be diffusion-bonded to aluminum at a low temperature not higher than the melting point of aluminum, and that the crystal structure can be controlled through recrystallization in the same temperature range; i.e., the crystal structure control of the titanium material and the diffusion bonding can be simultaneously carried out in a heating step.

As clearly understood from the description above, this invention is to provide a method of producing a sputtering titanium target assembly having a recrystallized structure of the target material and a diffusion-bond between the target material and the backing plate, wherein a cold-worked titanium material is brought into contact with an aluminum based backing plate material, and the two parts in contact are hot-pressed on an isostatic press machine, wherein the diffusion bonding of the two materials and the recrystallization of titanium are carried out.

The isostatic-press temperature used should preferably be 300° through 450° C. In order to make the sputtered grains fly in a uniform direction and to reduce the "particle" generation, titanium is recrystallized into a finer grain structure. Preferably, the average grain size of the recrystallized target material is not greater than 10 μm.

The surface of the titanium material bonded to the backing plate should preferably be roughened into a level of 6S through 12S based on JIS B0601-1976, Surface Roughness, so that a higher bonding strength can be obtained.

DETAILED DESCRIPTION OF THE INVENTION

Figure 1:
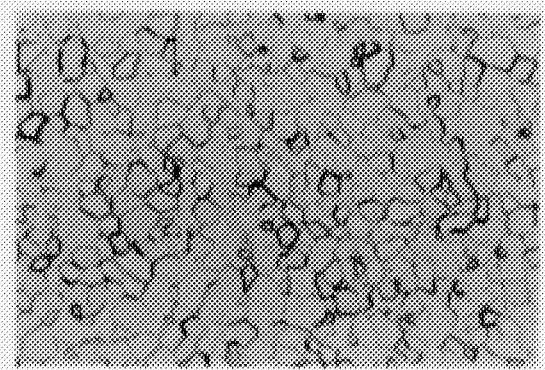
FIG. 1 is a microphotograph (400 magnifications) showing a metal microstructure of the target material of this invention.

The present invention is characterized by controlling the titanium structure and the bonding thereof to the backing plate by simultaneously carrying them out in a heating step using a hot isostatic press machine.

The inventors found that the size of the recrystallized titanium grains greatly depended on the press temperature and that the grain size did not show a remarkable growth within a few hours of the diffusion bonding process. They thus accomplished this invention wherein the regulation of the titanium crystal structure and the bonding thereof to the backing plate can be simultaneously carried out in a heating step.

Use of the heating step process can increase the productivity, eliminating the preliminary recrystallization process of titanium.

The condition of the isostatic press machine is set to a condition required to control the titanium structure, which can solve the problem of excessive crystal growth through heating after the structure control.

When diffusion bonding takes place at the same time as recrystallization, a strain in the recrystallized titanium structure can be relaxed to render the atoms more mobile. Thus, diffusion bonding occurs more readily than during a simple heating without accompanying the recrystallization of titanium.

Further, the present invention is also characterized by the use of an isostatic press machine. In a single-axis press-forming, pressure is perpendicularly applied to the bonded surfaces of the titanium target material and the backing plate, while a small deviation of the axis, if any, causes an uneven distribution of pressure on the bonded surface.

When the bonding is carried out at low temperatures for prevention of the excessive growth of crystals, the diffusion rate of the atoms on the boundary surfaces is greatly dependent on the pressure applied on the surface.

Because of this, an uneven pressure distribution directly leads to an uneven bonding with unbonded parts remaining. Thus, the obtained target assembly can not be used for those applications requiring high conductivities of heat and electricity.

On the other hand, an isostatic press machine gives an even distribution of pressure on the surfaces of the target material and the backing plate material, and prevents an uneven bonding between the two materials.

As mentioned earlier, the isostatic press temperature used in this invention should preferably be 300° through 450° C. At a lower temperature than 300° C., diffusion bonding hardly takes place even after a long retention of the temperature, while at a higher temperature than 450° C., coarsening of crystal grains tends to occur in the structure.

More specifically, a total reduction of 75% or higher of cold-rolling and an isostatic-press temperature of 450° C. or lower should preferably be required to obtain a metal structure of an average grain size of less than 10 μm.

Also, as mentioned earlier, the isostatic pressure should preferably be 50 to 200 MPa. A lower pressure than 50 MPa can hardly result in excellent bonding, while a higher pressure than 200 MPa is not practical because of limitations of press machine performance.

According to the method described above, a sputtering titanium target assembly comprising a titanium target material and an aluminum base backing plate can be obtained, wherein the titanium material has a recrystallized structure and the both are diffusion-bonded with each other.

The aluminum base backing plate used in the invention is selected from backing plates made of aluminum or an aluminum alloy such as duralumin. Aluminum is preferable because of its high electric conductivity. Not higher than 10% by weight of other elements, such as Si, Cu, Mn, Mg, Cr, Zn, Ti, and Zr, can be added to the aluminum base to increase the strength of the backing plate, which is required for large targets.

The pressure-transferring vessel used in the isostatic press machine of this invention should preferably be as flexible and deformable as possible at low temperatures, because low temperatures and high pressures are used in this invention, as mentioned earlier. In more detail, flexible aluminum vessels or pressure-transferring vessels made of metal foils not thicker than 0.5 mm should preferably be used. The metal foils used include pure iron, stainless steel, and aluminum. To prevent contamination of the target material, high-melting niobium or molybdenum can also be used.

When aluminum base vessels are used, the vessel itself can also be used as a backing plate material; a usual independent backing plate is not necessary, and the vessel can be diffusion-bonded to the titanium target material. After an isostatic press treatment, the vessel can be processed into a backing plate.

The surface of the titanium material used in the invention should preferably be roughened into a roughness level of 6S through 12S before bonded to a backing plate material. This is because titanium is harder than aluminum, whereby the uneven surface of the harder titanium intrudes into the softer aluminum base backing plate under a high isostatic pressure and works as an anchor, and also because an increased surface area of the roughened surface facilitates a diffusion-transfer of materials to increase the bonding strength. Thus, a low temperature bonding is accomplished by this invention.

Also, this unevenness of the roughened surface can break the oxidized layer which is readily formed on the surface of a backing plate in the bonding process. Thus, an exposed active surface of the backing plate also facilitates the material transfer. This also may increase the bonding strength.

EXAMPLE

Invention Example 1

A 5N grade titanium ingot (purity: 99.999%) was cold-forged, and cold-rolled into a plate used as a titanium material.

The obtained titanium material was machined to have a diameter of 300 mm, a thickness of 8 mm, and a surface roughness of 3.2 S.

On the other hand, an aluminum plate having an alloy number of 1050 and a duralumin plate having an alloy number of 2017 were machined into a backing plate having a diameter of 300 mm, a thickness of 25 mm, and a surface roughness of 2 S.

The bonding surfaces of the titanium material and the backing plate material were washed with 10% fluoronitric acid for removal of the oxidized layer and other contaminants. Then the surfaces were washed with pure water, and were dried with argon-blowing.

TABLE 1

| Target specimen number | Total reduction of cold-rolling (%) | Cold-rolling temperature (°C.) |
|---|---|---|
| T1 | 76 | Room temp. |
| T2 | 80 | " |
| T3 | 85 | " |
| T4 | 76 | 150 |
| T5 | 80 | 150 |
| T6 | 85 | 150 |
| T7 | 70 | 150 |

Then, the bonding surfaces of the titanium material and the backing plate were put together face to face, and were enclosed in a pure-aluminum capsule having a thickness of 3 mm.

This capsule was put into a furnace of a hot isostatic press machine, depressurized down to $5\times10^{-3}$ Pa, and the capsule was sealed.

Then, the hot isostatic press machine was gradually heated up to 400° C., whereby both surfaces were diffusion-bonded with each other and the titanium material was recrystallized at the same time in 5 hours under a pressure of 140 MPa.

After the treatment, a target assembly was obtained by lathing off the aluminum capsule wherein the titanium target material and the backing plate had been bonded with each other.

A sonic flaw-detector measurement indicated that the bonding rate was 100%.

At the machining stage, a tensile specimen having a length of 30 mm, a width of 30 mm, and a thickness of 12 mm was cut out of the bonded part of the target material, and the backing plate was combined to measure the bonding strength by perpendicularly applying a tensile load to the bonded surfaces. The average crystal grain size was also measured. Table 2 shows the results.

TABLE 2

| Specimen no. | Target material | Backing plate | Bonding Strength (MPa) | Average crystal grain size ($\mu$m) |
|---|---|---|---|---|
| 1 | T1 | Aluminum | 87 | 10 |
| 2 | T2 | " | 92 | 8 |
| 3 | T3 | " | 94 | 5 |
| 4 | T4 | " | 85 | 10 |
| 5 | T5 | " | 89 | 7 |
| 6 | T6 | " | 91 | 6 |
| 7 | T7 | " | 86 | 17 |
| 8 | T1 | Duralumin | 67 | 8 |
| 9 | T2 | " | 68 | 8 |
| 10 | T3 | " | 65 | 6 |
| 11 | T4 | " | 67 | 10 |
| 12 | T5 | " | 64 | 9 |
| 13 | T6 | " | 62 | 7 |
| 14 | T7 | " | 63 | 20 |

As shown in Table 2, duralumin backing plates had slightly lower bonding strengths than aluminum. Nevertheless, the bonding strengths were at least as high as 50 MPa, which is sufficiently high.

Also as shown in Table 2, bonding of the target material to the backing plate at 400° C. using an isostatic press machine induced no growth of crystal grains, and accomplished a well-regulated structure of the target material and an excellent diffusion bonding at the same time.

Using the obtained target assembly, the film-formability was evaluated with a vacuum of $5\times10^{-5}$ Pa, an argon pressure of 5 Pa, an electric power supply (per unit area of the target) of 15 W/cm$^2$, and a substrate temperature of 200° C. Table 3 shows the results.

The numbers of "particles" shown in Table 3 represent the numbers in a 6-inch wafer of the particles which are 0.3 $\mu$m or larger.

The bottom-coverage rates were calculated as the ratio of the film thickness at the bottom to/the film thickness at the top, wherein the both film thicknesses were measured in a contact hole having a diameter of 0.5 $\mu$m and an aspect ratio of 1.5.

TABLE 3

| Specimen no. | Number of "particles" | Bottom coverage (%) |
| --- | --- | --- |
| 1 | 11 | 24 |
| 2 | 12 | 23 |
| 3 | 9 | 28 |
| 4 | 14 | 25 |
| 5 | 10 | 23 |
| 6 | 10 | 25 |
| 7 | 19 | 22 |
| 8 | 12 | 24 |
| 9 | 14 | 24 |
| 10 | 11 | 27 |
| 11 | 15 | 24 |
| 12 | 12 | 25 |
| 13 | 10 | 24 |
| 14 | 20 | 22 |

As shown in Table 3, the bottom coverage was 20% or higher for all the specimens, and the number of "particles" were 20 or less.

A high bottom coverage means that much more sputtered grains reached the bottom of the contact hole and that sputtered grains from the target material were made to fly in a uniform direction Target materials T1 through T6 wherein the average crystal-grain size could be advantageously controlled to not greater than 10 $\mu$m, advantageously had less "particles" compared with the target material T7 which had a larger grain size than 10 $\mu$m, and advantageously gave higher bottom coverages.

Comparative Example

A titanium material was prepared in the same way as T1 in invention example 1, and was heated at 400° C. for recrystallization. An obtained titanium target material had a fine structure of 8 $\mu$m in average crystal grain size.

The titanium target material and a aluminum backing plate material were enclosed in a aluminum capsule having a wall thickness of 3 mm.

After depressurizing to 5×10⁻³, the capsule was sealed, the furnace internal temperature of the hot isostatic press machine was gradually raised, and the diffusion bonding was carried out in 5 hours at 500° C. under a pressure of 120 MPa.

After the diffusion bonding treatment, the aluminum capsule was cut off, and a target assembly was obtained, wherein the titanium target material and the aluminum backing plate were bonded with each other. The sonic flaw-detector measurement indicated that the bonding rate was 100%.

At the machining stage, a tensile specimen, 30 mm in length, 30 mm in width, and 12 mm in thickness, was cut out of the bonded body of the target material and the backing plate material, a tensile load was applied perpendicularly to the bonded surface, and the tensile bonding strength was measured. The average crystal grain size was also measured after the heat treatment. The bonding strength was 94 MPa, which was excellent, while the average crystal grain size was 25 $\mu$m, which indicated a growth to a much larger size compared with the size in the original target material.

Figure 2:
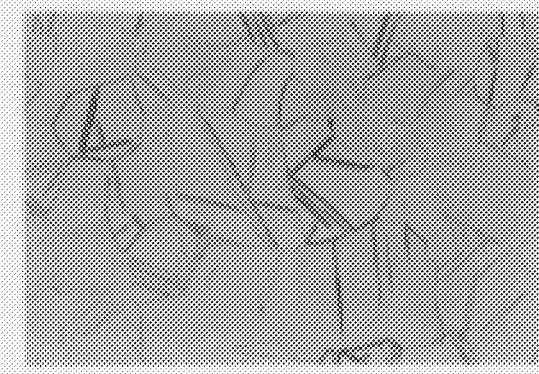
FIG. 2 is a microphotograph (400 magnifications) showing a metal microstructure of the target material of the comparative example.

FIG. 2 is a photograph of the grown-up microstructure in the target of the comparative example.

This target material was subjected to a film-formability test as in invention example 1. The number of "particles" not smaller than 0.3 $\mu$m were 24 in a 6-inch wafer, and the bottom-coverage rate was 20%, which results were inferior to the results in invention example 1.

Invention Example 2

The same titanium materials T1 through T3 and the same pure-aluminum backing-plate both as in invention example 1 were prepared. The bonded surfaces were put together, and were enclosed in capsules.

These capsules were put into a furnace of a hot isostatic press machine, and after being depressurized to 5×10⁻³ Pa, the capsules were sealed.

Then, the furnace temperature of the hot isostatic press machine was gradually raised, and the final temperature was retained for 5 hours. The pressure and the temperature were changed for confirmation of the effects of temperature and pressure in an isostatic press machine.

The capsule used was an aluminum can having a thickness of 3 mm, when the isostatic-press temperature was 400° C. or higher. When the temperature was 400° C. or lower, a molybdenum foil having a thickness of 0.1 mm was used.

After the treatment, the aluminum capsules were lathed off and target assemblies were obtained wherein the titanium target material and the aluminum backing plate were bonded with each other.

A sonar flaw-detection proved that the bonding rates were 100% for all the target specimens.

At the machining stage, tensile specimens having a length of 30 mm, a width of 30 mm, and a thickness of 12 mm were cut out of the bonded target. Tensile loads were perpendicularly applied to the bonded surfaces to measure bonding strengths. The average crystal grain diameters were also measured. Table 4 shows the results. FIG. 1 shows a typical microstructure of the target material of this invention.

TABLE 4

| Specimen no. | Target material | Isostatic Press | | Bonding strength (MPa) | Average crystal grain size ($\mu$m) | Note |
| | | Temperature (°C.) | Pressure (MPa) | | | |
| --- | --- | --- | --- | --- | --- | --- |
| 15 | T1 | 280 | 150 | Failed to bond | Failed to recrystallize | Comparative specimen |
| 16 | T1 | 350 | 150 | 56 | 10 | Invention specimen |
| 17 | T1 | 400 | 150 | 85 | 10 | Invention specimen |
| 18 | T1 | 400 | 120 | 82 | 10 | Invention specimen |

TABLE 4-continued

| Specimen no. | Target material | Isostatic Press Tempera- ture (°C.) | Pressure (MPa) | Bonding strength (MPa) | Average crystal grain size (μm) | Note |
|---|---|---|---|---|---|---|
| 19 | T1 | 450 | 120 | 90 | 16 | Invention specimen |
| 20 | T1 | 500 | 120 | 90 | 31 | Invention specimen |
| 21 | T3 | 350 | 150 | 60 | 4 | Invention specimen |
| 22 | T3 | 400 | 150 | 91 | 6 | Invention specimen |
| 23 | T3 | 400 | 120 | 86 | 5 | Invention specimen |
| 24 | T3 | 450 | 120 | 92 | 17 | Invention specimen |
| 25 | T3 | 500 | 120 | 96 | 33 | Invention specimen |
| 26 | T3 | 450 | 45 | 38 | 16 | Invention specimen |

As shown by specimen No. 15 in Table 4, the titanium material and the backing plate could not be bonded with each other at 280° C. under a pressure of 150 MPa. At 300° C. or higher, bonding between the target material and the backing plate was excellent, while a temperature as high as 500° C. caused crystal grains to grow to considerably larger sizes (See sample numbers 20 and 25).

An isostatic pressure of 50 MPa or lower gave a lower bonding strength (See sample no. 26).

As shown in Table 4, a regulated target material and a diffusion bonding can be accomplished at the same time, and by changing the conditions of the isostatic press machine, the bonding strength and the average crystal grain size could be controlled.

Invention Example 3

The same target material as T1 in invention example 1 was produced, and the same aluminum backing plate as in the invention example 1 was prepared.

The bonding surface of the target material was processed to the roughnesses shown in Table 5.

The diffusion-bonded titanium target material was recrystallized at 400° C., under 140 MPa, and in 5 hours in the same way as in the invention example 1.

A titanium target material and an aluminum backing plate material of the same size and grade were prepared. The surface roughness of the titanium target was changed to 1 S, 2 S, 6.3 S, 12 S as shown in Table 1, and the surfaces were diffusion-bonded with other conditions kept unchanged from those in the invention example 1, and the combined parts were machined into targets.

The target material had an average grain size of 10 μm, showing that no grain growth of crystals occurred.

The bonding strength was measured for confirmation of the effect of roughness on the bonding of the titanium surface in the same way as in the invention example 1. Table 5 shows the results.

As shown in Table 5, an increased surface roughness increased the bonding strength.

TABLE 5

| No. | Surface roughness Target material | Backing plate | Bonding strength (MPa) |
|---|---|---|---|
| 27 | 1S | 2S | 68 |
| 28 | 2S | 2S | 83 |
| 29 | 6.3S | 2S | 91 |
| 30 | 12S | 2S | 94 |

According to the present invention, wherein a hot isostatic press machine is used to accomplish regulation of the titanium material structure and to bond the titanium material and the backing plate together at the same time, a preliminary regulation of the titanium material structure becomes unnecessary, which can curtail a processing stage and thus can increase the productivity.

By setting the isostatic press to the conditions necessary for regulating the titanium target material structure, a problem can be solved, which is the coarsening of crystal grains due to heating after the regulation of the material structure. Thus, a fine titanium structure can be correctly obtained, by which "particles" generation is restrained and the sputtered grains are made to fly in a uniform direction.

What is claimed is:

1. A method of producing a sputtering titanium target assembly which comprises a target material of titanium having a recrystallized structure and a backing plate which are bonded with each other by diffusion bonding, wherein the method comprises the following steps:

superimposing a cold-worked titanium material with a backing plate material made of any one of aluminum and aluminum base alloys; and subjecting the superimposed materials to isostatic hot pressing so as to diffusion-bond those materials with each other and simultaneously cause said titanium material to recrystallize, wherein said step of subjecting the superimposed materials to isostatic hot pressing is controlled so that said titanium material recrystallizes to have a recrystallized structure with an average crystal grain size of not greater than 10 μm.

2. A method of producing a sputtering titanium target assembly according to claim 1, wherein said isostatic hot pressing is carried out under a pressure of 50 to 200 MPa at a temperature of 300° C. to 450° C.

3. A method of producing a sputtering titanium target assembly according to claim 1, wherein the surface of said titanium material, which is to be bonded to said backing plate, is previously subjected to a surface roughening treatment to provide it with a surface roughness of 6S to 12S.

4. A method of producing a sputtering titanium target assembly according to claim 2, wherein the surface of said titanium material, which is to be bonded to said backing plate, is previously subjected to a surface roughening treatment to provide it with a surface roughness of 6S to 12S.

* * * * *